US006211065B1

(12) United States Patent
Xi et al.

(10) Patent No.: US 6,211,065 B1
(45) Date of Patent: Apr. 3, 2001

(54) METHOD OF DEPOSITING AND AMORPHOUS FLUOROCARBON FILM USING HDP-CVD

(75) Inventors: Ming Xi; Eugene Tzou, both of Sunnyvale; Lie-Yea Cheng, Palo Alto; Turgut Sahin, Cupertino; Yaxin Wang, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/948,799

(22) Filed: Oct. 10, 1997

(51) Int. Cl.$^7$ ................................................. C23C 16/22

(52) U.S. Cl. ....................... 438/627; 438/628; 427/490; 427/577; 427/249.1; 427/535; 427/255.26; 427/255.391; 427/250; 427/255.4; 204/192.17

(58) Field of Search ..................... 427/490, 577, 427/249.1, 535, 255.2, 250, 255.4, 255, 255.391; 438/627, 628; 204/192.17

(56) References Cited

U.S. PATENT DOCUMENTS

| 4,782,380 | * 11/1988 | Shankar et al. ........................ 357/71 |
| 5,589,233 | 12/1996 | Law et al. ............................ 427/579 |
| 5,804,259 | * 8/1998 | Robles ................................. 427/577 |

FOREIGN PATENT DOCUMENTS

| 0 540 444 A1 | 10/1992 | (EP) . |
| 0 701 283 A2 | 9/1995 | (EP) . |
| 701283 | * 3/1996 | (EP) . |
| 2299345 | * 10/1996 | (GB) . |

OTHER PUBLICATIONS

Robles et al., "Characterization of High Density Plasma Chemical Vapor Deposited α–Carbon and α–Fluorinated Carbon Films for Ultra Low Dielectric Applications", DUMIC Conference, Feb. 10–11, 1997, pp. 26–33.

Robles et al., Characterization High Density Plasma Chemical Vapor Deposited a–Carbon and a–Fluorinated Carbon Films For Ultra Low Dielectric Applications, unknown.*

Endo et al., Mat. Res. Soc. Symp. Proc., vol. 381, pp. 249–254. (month unknown), 1995.*

Y. Matsubara, K. Endo, T. Tatsumi, H. Ueno, K. Sugai, and T. Horiuchi, "Low–k Fluorinated Amorphous Carbon Interlayer Technology for Quarter Micron Devices," pp. 14.6.1–14.6.4, 1996 (no month).

Stuardo Robles, Loreto Vasquez, Moshe Eizenberg, and Farhad Moghadam, Characterization of High Density Plasma Chemical Vapor Deposited α–Carbon and α–Fluorinated Carbon Films For Ultra Low Dielectric Applications, 8 pp., (no date).

A. Grill, V. Patel, K.L. Saenger, C. Jahnes, S.A. Cohen, A.G. Schrott, D. C. Edelstein, and J.R. Paraszczak, IBM–Research Division, "Diamondlike Carbon Materials as Low–k Dielectrics For Multilevel Interconnects in ULSI." 10 pp., Fall 1996.

(List continued on next page.)

Primary Examiner—Timothy Meeks
(74) Attorney, Agent, or Firm—Thomason, Moser & Patterson

(57) ABSTRACT

The present invention provides a method of depositing an amorphous fluorocarbon film using a high bias power applied to the substrate on which the material is deposited. The invention contemplates flowing a carbon precursor at rate and at a power level so that equal same molar ratios of a carbon source is available to bind the fragmented fluorine in the film thereby improving film quality while also enabling improved gap fill performance. The invention further provides for improved adhesion of the amorphous fluorocarbon film to metal surfaces by first depositing a metal or TiN adhesion layer on the metal surfaces and then stuffing the surface of the deposited adhesion layer with nitrogen. Adhesion is further improved by coating the chamber walls with silicon nitride or silicon oxynitride.

19 Claims, 9 Drawing Sheets

OTHER PUBLICATIONS

Kazuhiko Endo and Toru Tatsumi, "Preparation and Properties of Fluorinated Amorphous Carbon Thin Films By Plasma Enhanced Chemical Vapor Deposition," pp. 249–254, 1995 (no month).

S. Takeishi, H. Kudo, R. Shinohara, M. Hoshino, S. Fukuyama, J. Yamaguchi, and M. Tamada, "Fluorocarbon Films Deposited by PECVD with High Thermal Resistance and Low Dielectric Constants," pp. 71–77, (no date).

Alfred Grill, "Diamondlike Carbon Materials As Low–k Dielectrics For Multilevel Interconnects in ULSI," Abstract, 2 pp., (no date).

U.S. application No. 08/840,209, Chen et al., filed Apr. 11, 1997.

U.S. application No. 08/948,890, Xi et al., filed Oct. 10, 1997.

U.S. application No. 08/948,895, Sahin et al., filed Oct. 10, 1997.

* cited by examiner

SP = 1000 W
BP = 1000 W

SP = 1000 W
BP = 100 W

METHOD OF DEPOSITING AND AMORPHOUS FLUOROCARBON FILM USING HDP-CVD

BACKGROUND OF THE INVENTION

1. Field of the Invention

The present invention relates generally to the deposition of an amorphous fluorocarbon film using a high density plasma chemical vapor deposition (HDP-CVD) technique. More particularly, the present invention relates to a method of depositing an amorphous fluorocarbon film using a high bias power to enhance gap fill performance. Still further, the invention relates to improving adhesion of a fluorine containing dielectric material to metal surfaces formed on a substrate.

2. Background of the Invention

Consistent and fairly predictable improvement in integrated circuit design and fabrication has been observed in the last decade. However, for newer ultra large scale integration (ULSI) products with operation frequencies approaching 1 GHz and interconnect feature sizes decreasing to $\leq 0.25$ µm, interconnect resistance-capacitance (RC) delay will represent a large portion of the clock time of integrated circuits, and significantly new and different manufacturing approaches will be required to achieve the required performance goals. Since RC delay is directly related to the interconnect resistance and dielectric capacitance, the industry focus is on developing new materials with significantly lower dielectric constants and lower resistivities.

In the area of dielectrics, a great variety of materials are being investigated as potential replacements for the current standard silicon dioxide ($SiO_2$). If $SiO_2$, which has a dielectric constant (K)~4, is replaced by another material with a K value of ~2.5, RC delay and cross talk will be significantly reduced and overall circuit performance will be greatly improved. It is well accepted that a dielectric constant of <3.0 will be required at the 0.18 µm device generation in order to meet expected performance requirements.

A great variety of materials with low dielectric constants are being investigated as potential candidates to replace $SiO_2$. However, it is important to remember that dielectric constant is but one of the critical requirements that must be met. Ease of integration into existing and future process fabrication flows and economic factors (e.g., cost of ownership) will together decide the viability of a material for use as the next generation intermetal dielectric (IMD). Integration capability will be determined by critical properties Such as adhesion, thermal stability, thermal conductivity, mechanical strength and gap fill performance. Cost of ownership will be determined by cost of the raw materials, cost of processing waste material (which has been found to be especially high with spin-on techniques), the number of required integration steps as well as the capital cost of the processing equipment. The ideal low dielectric constant material will easily integrate into existing process flows, will use existing equipment, and cost no more than processes in use today.

CVD-deposited materials are the most promising approach for low dielectric constant materials. It is well accepted that the mechanisms in plasma assisted depositions will lead to materials with significantly higher density and mechanical strength than other types of deposition techniques. In addition, integration of a CVD film is well characterized and fairly simple as compared with wet processes such as spin-on methods. The potential of using existing plasma enhanced CVD equipment and simple manufacturing methodology makes CVD materials attractive from both an integration and an economic standpoint.

Among the CVD-deposited materials, amorphous fluorocarbon ($\alpha$-FC) is promising for its relatively high thermal stability, low dielectric constant value (as low as 2.3), thermal conductivity close to that of $SiO_2$, and good mechanical strength. Recently, Matsubara et al., "Low-k Fluorinated Amorphous Carbon Interlayer Technology for Quarter Micron Devices", IEDM, p 369–372 (1996), have described the successful integration and use of $\alpha$-FC as the intermetal dielectric in a three-level metallization structure. A 50% decrease in line capacitance is reported using this dielectric material.

However, as geometries shrink, gap fill performance becomes a significant issue. Gap fill performance generally refers to the ability of a process to fill the area, known as trenches, between metal lines. Recently, the trend has been to incorporate high density plasma processes into integrated sequences to take advantage of in situ sputter etch and deposition to achieve enhanced gap fill results. In HDP-CVD, a bias power is coupled to the substrate to attract ions which sputter the field of the substrate during deposition, thereby preventing a phenomena known as crowning where the deposition material converges over the trench before the trench is completely filled with the deposition material. By controlling the deposition rate on the field (i.e., the area between the trenches) of the substrate, improved gap fill performance in small features $\leq 0.25$ µm can be achieved.

One problem associated with $\alpha$-FC films is that application of a high bias power tends to enhance fragmentation of fluorine which is then incorporated into the resulting film as loose unbonded F or $CF_x$ (x=1–4). It has been well documented that organic fluorocarbon molecules will either form etching species such as $F^-$ or polymerize under glow discharge conditions. Whether etching or the polymerization reaction will dominate depends on plasma energy, charged specie intensities, reactant ratios and surface temperatures. EP patent application Serial No. 5114253.8 discusses the problems associated with high bias power and attempts to resolve the problems by eliminating the use of high bias power in the deposition of an ($\alpha$-FC film.

Another problem encountered is that fluorine generated during deposition of the fluorine containing dielectric materials is adsorbed by the chamber walls and chamber components and is out gassed during subsequent deposition steps. The fluorine attacks the metal surfaces on the substrate and prevents good adhesion. Titanium nitride is frequently used as a barrier layer between dielectric layers and metal layers and is somewhat resistant to diffusion of process gases. However, titanium nitride does not substantially improve adhesion between the metal surfaces and the fluorine containing dielectric materials.

Therefore, there is a need to improve the application of HDP-CVD technology for deposition of very low dielectric constant $\alpha$-FC films. It would be advantageous to provide an ($\alpha$-FC film having a dielectric constant (k) of 2.8 or less which can be deposited using high density plasma deposition, exhibits good gap fill performance in features 0.25 µm and smaller and which is stable with a single post deposition anneal.

SUMMARY OF THE INVENTION

The present invention provides a method of forming an amorphous fluorocarbon film having both thermal stability and a low dielectric constant. The method comprises the steps of introducing a substrate into a process chamber and positioning the substrate on a support member connected to a bias power source, introducing a carbon source gas and a fluorine source gas into the process chamber, delivering a source power to the chamber sufficient to strike a plasma in the chamber, and applying a bias power to the support member at a power level sufficient to achieve in situ sputter deposition on the substrate. The carbon gas source and fluorine gas source are preferably introduced in sufficient amount to maintain an atomic ratio of F:C less than 2.

Another aspect of the invention provides a season coating of silicon nitride or silicon oxynitride on internal surfaces of the deposition chamber prior to substrate processing to prevent out gassing of fluorine or fluorine compounds from the chamber surfaces. In one embodiment, silicon nitride or silicon oxynitride is deposited on internal surfaces of a deposition chamber in an amount sufficient to block out gassing of fluorine from the internal surfaces. The amount of outgassed fluorine can be controlled to prevent unwanted incorporation of free fluorine into the resulting fluorine containing film. This aspect of the invention can be combined with the use of an adhesive layer formed on the metal surfaces, such as the nitrogen treated Ti or TiN, to further prevent fluorine attack on the metal surfaces.

The present invention further provides a method of enhancing adhesion of a fluorine containing dielectric material to metal surfaces formed on a substrate, comprising the steps of depositing an adhesive metal layer, such as titanium (Ti) or titanium nitride (TiN) on a substrate comprising metal surfaces, forming a metal/$N_2$ surface on the adhesive metal layer by exposing the adhesive metal layer to nitrogen, and depositing a fluorine containing dielectric material on the metal/$N_2$ surface of the adhesive metal layer. The deposited metal layer is preferably exposed to a nitrogen plasma provided by capacitively or inductively coupling energy.

BRIEF DESCRIPTION OF THE DRAWINGS

The file of this patent includes at least one drawing executed in color. Copies of this patent with color drawings will be provided by the Patent and Trademark Office upon request and payment of the necessary fee.

DETAILED DESCRIPTION OF A PREFERRED EMBODIMENT

The present invention provides an improved method of depositing an amorphous fluorocarbon ($\alpha$-FC) film on a substrate or other workpiece using high density plasma chemical vapor deposition techniques. Generally, it has been discovered that the film quality and gap fill performance can be enhanced by controlling the gas concentrations while applying a high bias power (~100 W or higher) to the substrate. Specifically, thermal stability and a low dielectric constant can be achieved in an $\alpha$-FC film with good gap fill performance and improved adhesion to metals by controlling the relative concentrations of a fluorine source and a carbon source while applying a sputtering bias power to the substrate. In one embodiment, an amorphous fluorocarbon film is deposited from methane ($CH_4$) and octafluorocyclobutane ($C_4F_8$) using a HDP-CVD reactor. The resulting film is thermally stable with a dielectric constant (K) value <2.8 up to 450° C. The film is believed to have an increased molecular weight, increased cross linking and improved stress in comparison to known $\alpha$-FC films.

The present invention also provides a method for depositing a seasoning film on the interior surfaces of the reactor to reduce the likelihood of outgassing of fluorine and other contaminants from the reactor walls and other components which further improves adhesion and stability of the resulting fluorine containing film. In one embodiment, a silicon nitride or silicon oxynitride film is deposited at a thickness of about 100 Å on the internal chamber surfaces.

The invention also provides a method for depositing an adhesion layer on a substrate, comprising the steps of depositing an adhesive metal layer, such as Ti or TiN, on a substrate, and exposing the adhesive metal layer to nitrogen. The substrate is preferably positioned adjacent a process zone in which a nitrogen plasma is generated to expose the deposited adhesive metal layer to nitrogen ("stuffed with") to alter the structure of the deposited metal layer. This altered surface is believed to improve the adhesion of the fluorine containing dielectric over the Ti/TiN layer without such treatment.

The methods of the present invention are preferably performed on an Ultima HDP-CVD™ Centura® System available from Applied Materials, Inc. located in Santa Clara, Calif. The features of the system are generally described below. It is to be understood that while the below described HDP-CVD system is the best system known to the inventors, other systems, may also be used, or modified to be used, to advantage to accomplish the methods of the present invention.

Figure 1A:
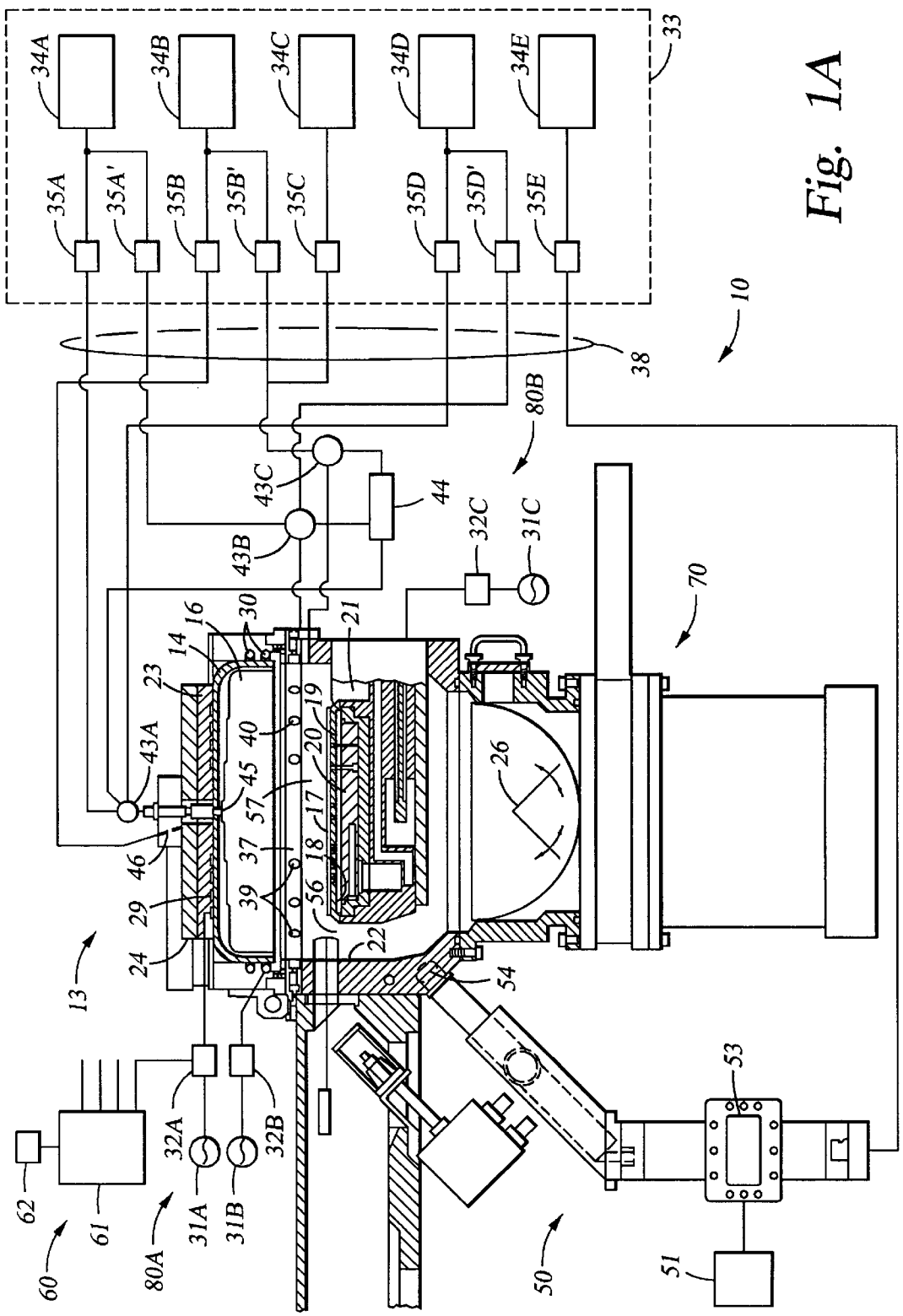
FIG. 1a is a simplified diagram of one embodiment of a high density plasma chemical vapor deposition system according to the present invention.

FIG. 1A illustrates one embodiment of a HDP-CVD system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a dielectric material, such as alumina or aluminum nitride. Dome 14 defines an upper boundary of a plasma processing region 16. Plasma processing( region 16 is bounded on the bottom by the upper surface of substrate 17 and the substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C.

The lower portion of clhamber 13 includes a body member 22, which joins the chamber to the vacuum system 70 which has a throttle valve 26. A base portion 21 of substrate support member 18 is mounted on, and forms a continuous inner surface with, body member 22. Substrates are transferred into and out of chamber 13 at all upper loading position 57 and moved to a lower processing position 56 in which the substrate is placed on a substrate receiving portion 19 of substrate support member 18. Substrate receiving portion 19 includes an electrostatic chuck 20 that secures the substrate to substrate support member 18 during substrate processing.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, while side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (i.e., ions) created by the source plasma system 80A to the surface of the substrate. In a specific embodiment, bias RF generator provides up to 5,000 watts of RF power at 13.56 MHz which allows the bias generator, in at least one embodiment, to supply a range of bias power between about 500 watts to about 2000 watts.

Matching networks 32A and 32B match the output impedance of generators 31A and 31B with their respective coils 29 and 30. The RF control circuit may tulle both matching networks by changing the value of capacitors within the matching networks to match the generator to the load as the load changes. The RF control circuit may tune a matching network when the power reflected from the load back to the generator exceeds a certain limit. One way to provide a co match, and effectively disable the RF control circuit from tuning the matching network, is to set the reflected power limit above any expected value of reflected power. This may help stabilize a plasma under some conditions by holding the matching network constant at its most recent condition.

Figure 1B:
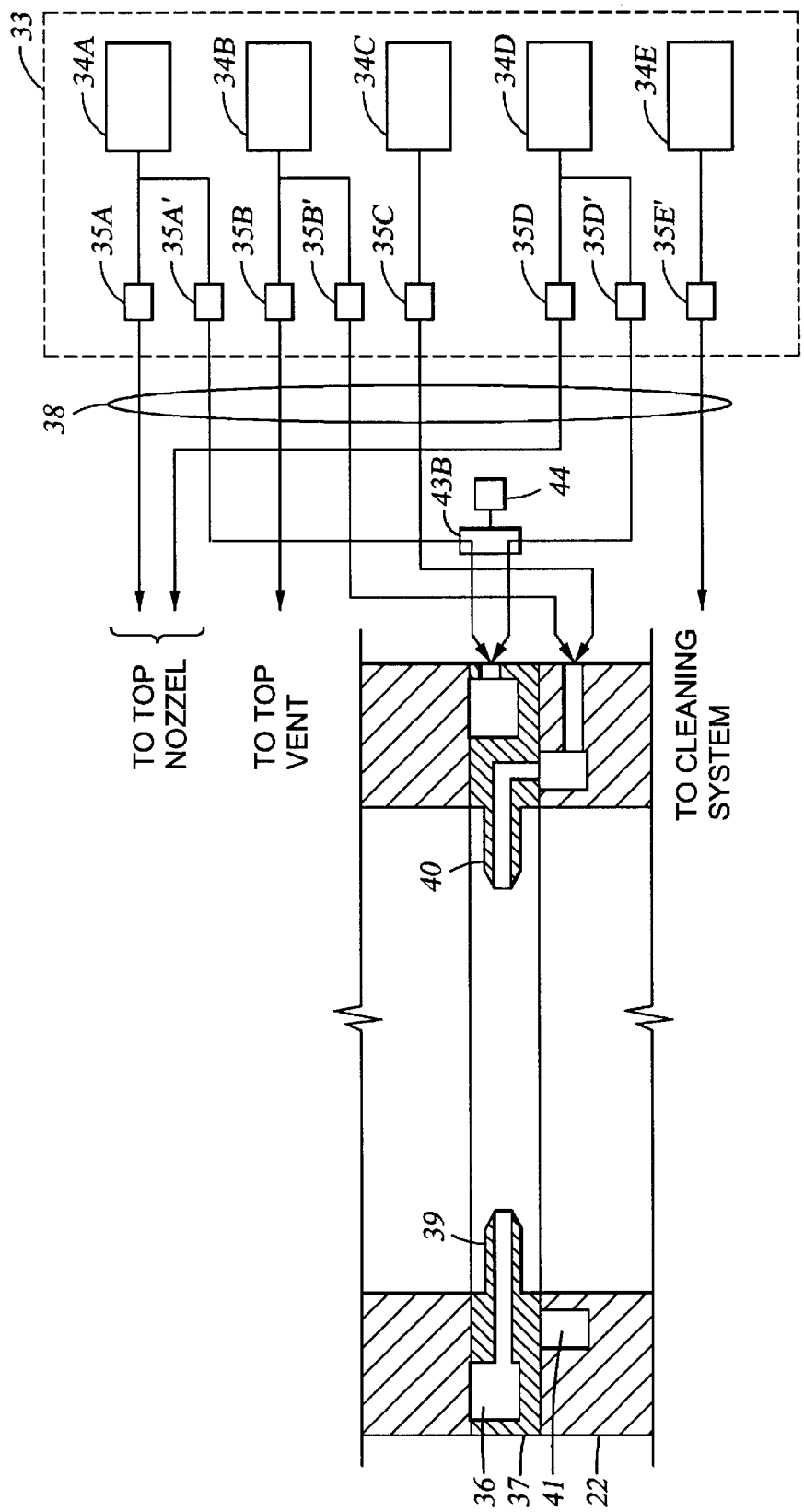
FIG. 1b is a simplified cross section of a gas ring that may be used in conjunction with the exemplary CVD processing chamber of FIG. 1A.

A gas delivery system 33 provides oases from several sources to the chamber for processing the substrate via gas delivery lines 38 (only some of which are shown). Gases are introduced into chamber 13 through a gas ring 37 and a top nozzle 45. FIG. 1B is a simplified, partial cross-sectional view of chamber 13 showing additional details of gas ring 37. In one embodiment, first and second gas sources, 34A and 34D, and first and second gas flow controllers, 35A' and 35D', provide gas to a ring plenum 36 in gas ring 37 via gas delivery lines 38 (only some of which are shown). Gas ring 37 has a plurality of source gas nozzles 39 (only one of which is shown in FIG. 1B) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles.

Gas ring 37 also has a plurality of oxidizer gas nozzles 40 (only one of which is shown), which in a preferred embodiment are co-planar with, and shorter than, source (,as nozzles 39, and in one embodiment receive gas from a body plenum 41. In some embodiments it is desirable not to mix source (gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34B and 34C, and third and fourth gas flow controllers, 35B' and 35C, provide gas to the body plenum via gas delivery lines 38.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition. Top vent 46 is an annular opening around top nozzle 45. In one embodiment, first gas source 34A is a $C_4F_8$ or $CH_4$ source that supplies source gas nozzles 39 and top nozzle 45. Source nozzle mass flow controller (MFC) 35A' controls the amount of $C_4F_8$ or $CH_4$ delivered to source gas nozzles 39 and top nozzle MFC 35A controls the amount of $C_4F_8$ or $CH_4$ delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed before they flow into chamber 13. Separate sources of the same gas may be used to supply various portions of the chamber.

System controller 60 controls the operation of system 10. In a preferred embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure having a 16-bit data bus and 24-bit address bus. System controller 60 operates under the control of a computer program stored on the hard disk drive or other computer programs, such as programs stored on a floppy disk. The computer program dictates, for example, the timing, mixture of gases, RF power levels and other parameters of a particular process. System controller 60 includes a processor 61 coupled to a memory 62. Preferably, memory 62 may be a hard disk drive, but of course memory 62 may be other kinds of memory, such as ROMN, PROM, and others.

Figure 1C:
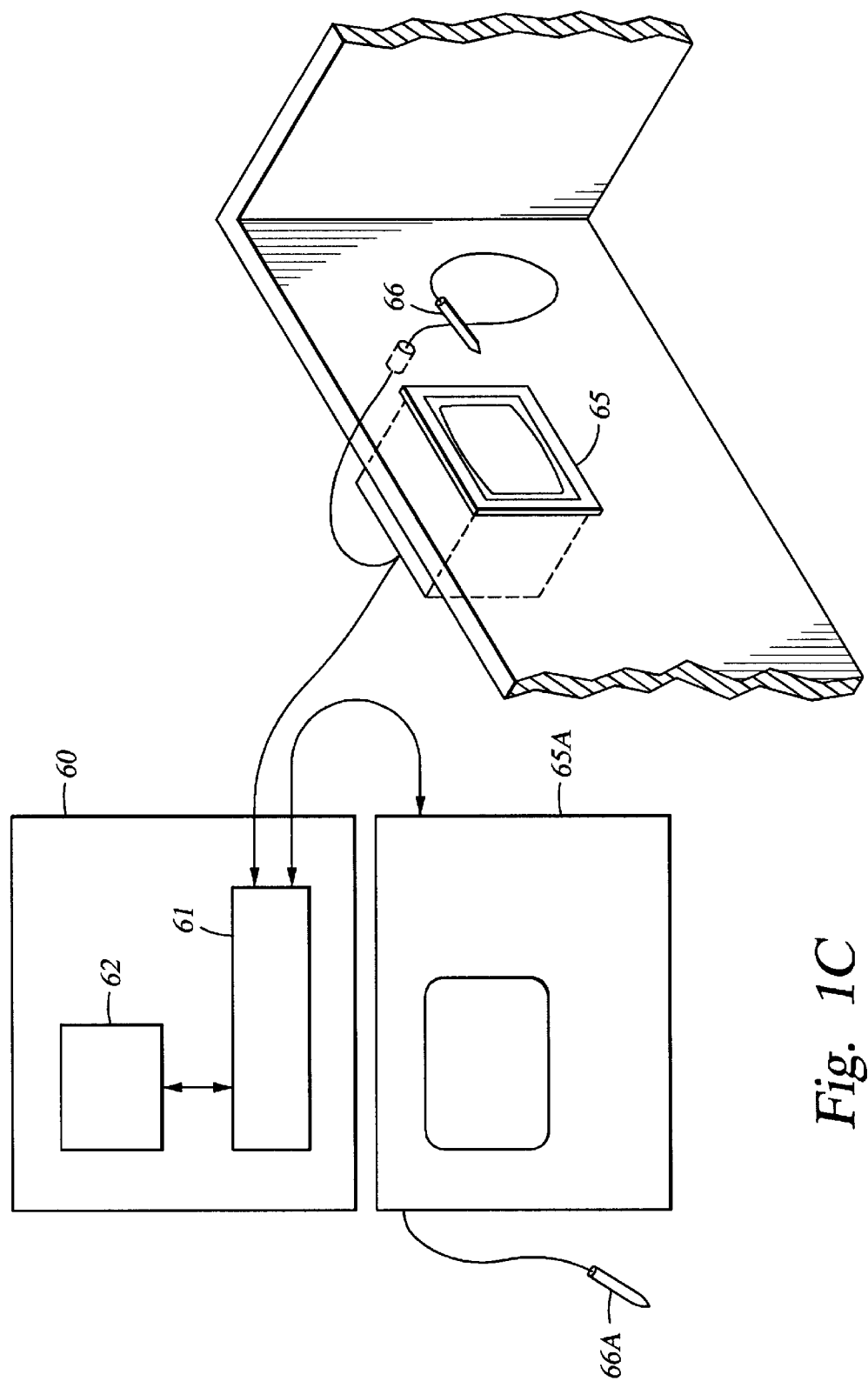
FIG. 1c is a simplified diagram of a monitor and light pen that may be used in conjunction with the exemplary CVD processing chamber of FIG. 1A.

System controller 60 operates under the control of a computer program. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, are used, one mounted in the clean room wall for the operators and the other behind the wall for the service technicians. Both monitors simultaneously display the same information, but only one light pen (e.g., 66) is enabled. To select a particular screen or function, the operator touches an area of the display screen and pushes a button (not shown) on the pen. The touched area confirms being selected by the light pen by changing( its color or displaying a new menu, for example.

The computer pro(gram code can be written in any conventional computer readable programming language such as 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

Figure 1D:
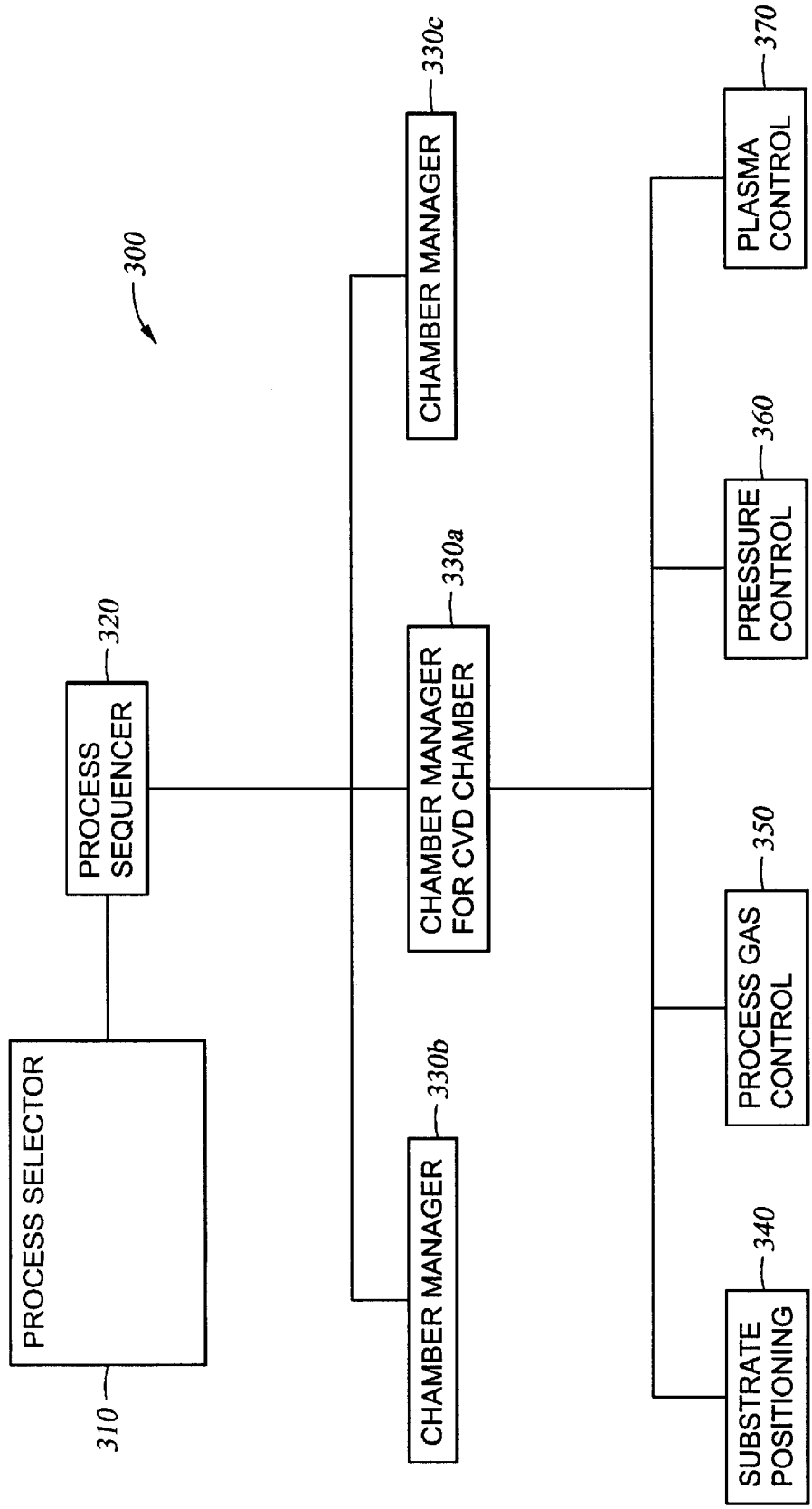
FIG. 1d is a flow chart of an exemplary process control computer program product used to control the exemplary CVD processing chamber of FIG. 1A.

FIG. 1D shows an illustrative block diagram of the hierarchical control structure of computer program 300. A user enters a process set number and process chamber number into a process selector subroutine 310 in response to menus or screens displayed on the CRT monitor by using the light pen interface. The process sets are predetermined sets of process parameters necessary to carry out specified processes, and are identified by predefined set numbers. Process selector subroutine 310 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers, Multiple users can enter process set numbers and process chamber numbers, or a user can enter multiple process set numbers and process chamber numbers so sequencer subroutine 320 operates to schedule the selected processes in the desired sequence. Preferably, sequencer subroutine 320 includes a program code to perform the steps of (i) monitoring the operation of the process chambers to determine if the chambers are being used, (ii) determining, what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is (Doing to be executed next, sequencer subroutine 320 causes execution of the process set by passing the particular process set parameters to a chamber manager subroutine 330A–C, which controls multiple processing tasks in chamber 13 and possibly other chambers (not shown) according to the process set determined by sequencer subroutine 320.

Examples of chamber component subroutines are substrate positioning subroutine 340, process gas control subroutine 350, pressure control subroutine 360, and plasma control subroutine 370. Those heaving ordinary skill ill the art will recognize that other chamber control subroutines can be included depending on what processes are desired to be performed in chamber 13. In operation, chamber manager subroutine 330A selectively schedules or calls the process component subroutines in accordance with the particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. Substrate positioning subroutine 340 comprises program code for controlling chamber components that are used to load a substrate onto substrate support number 18. Substrate positioning subroutine 340 may also control transfer of a substrate into chamber 13 from, e.g., a PECVD reactor or other reactor in the multichamber system, after other processing has been completed.

Process gas control subroutine 350 has program code for controlling process gas composition and flow rates. Subroutine 350 controls the open/close position of the safety shut-off valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates.

Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber. The above-described steps may then be carried out.

Furthermore, the process gas control subroutine 350 includes steps for obtaining the necessary delivery gas flow rate for the desired process gas flow rate by accessing a stored table containing the necessary values for a given process gas flow rate. Once the necessary values are obtained, the delivery gas flow rate is monitored, compared to the necessary values and adjusted accordingly.

The process gas control subroutine 350 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 360 includes program code for controlling the pressure in chamber 13 by regulating( the size of the opening of throttle valve in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure, Alternatively, the chamber pressure may be measured, with a manometer for example, and throttle valve 26 position may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 360 is invoked, the desired, or target, pressure level is received as a parameter from chamber manager subroutine 330A. Pressure control subroutine 360 operates to measure the pressure in chamber 13 by reading one or more conventional pressure manometers connected to the chamber, compare the measure value (s) to the target pressure, obtain proportional, integral, and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size, to regulate the pressure hi chamber 13 to a desired pressure or pressure range.

Plasma control subroutine 370 comprises program code for controlling the frequency and power output setting of RF generators 31A and 31B, and for tuning matching networks 32A and 32B. Plasma control subroutine 370, like the previously described chamber component subroutines, is invoked by chamber manager subroutine 330A.

The Deposition Process Sequence

At the 0.18 $\mu$m technology generation, it is expected that both damascene and conventional dielectric gap fill fabrication schemes will be used. For application in conventional process flows, gap filling of 0.18 $\mu$m spaces with a 3:1 aspect ratio will be required. The inventors have discovered a gap filling mechanism under HDP-CD deposition conditions which demonstrates comparable performance with conventional oxides. The present invention will now be described with reference to a preferred process sequence practiced on the above described processing system.

In one embodiment, the inventors have discovered that application of a bias power >100 W to the substrate support member and capacitively coupled to the substrate during deposition of an $\alpha$-FC film results in improved film composition and good gap fill performance in small features, i.e., 0.25 $\mu$m in width and smaller. The temperature of the substrate is preferably maintained at a temperature below 450° C. during processing. It was believed prior to the present invention that increasing the bias power above 100 W resulted in more fragmentation of the fluorine precursor which becomes a free $F^-$ source which can be trapped in the film. Incorporation of excess $F^-$ into the film decreases the carbon-carbon crosslinking of the $\alpha$-FC film and lowers the thermal stability of the film. In addition, free $F^-$ has the deleterious effects of causing current leakage and charge being trapped within the film. In addition, more free $F^-$ in the reactant mixture: increases the etch rate of the deposited film, thereby decreasing the deposition rate.

The present invention combats these problems by adding a carbon source, such as methane or acetylene, into the chamber to react with and bind the fragmented fluorine. The carbon source also typically provides a hydrogen source to scavenge unwanted free fluorine atoms. It is believed that increasing the available carbon in the reactant vases binds the fragmented fluorine and the hydrogen acts as a fluorine scavenger. Some of the $C_xF_y$ fragments (x=1–4; y=3–8) are volatile and can be pumped away from the chamber. As a result, the resulting film incorporates less free fluorine atoms and demonstrates improved chain branching. Increased chain branching results in a more thermally stable film having a low dielectric constant.

Preferably, the carbon source is flown into the chamber to decrease the atomic ratio of F:C in the precursor gases to less than two (2). Both flow rate and power levels are adjusted to ensure that the F:C ratio is less than two (2) in the chamber.

In one embodiment performed on a 200 mm substrate, the preferred precursor gases are octafluorocyclobutane ($C_4F_8$) and methane ($CH_4$) which are flown into the chamber at a selected rate to maintain the atomic ratio of less than 2 (two), preferably in a range between about 20 sccm and about 200 sccm. Argon, or other inert (gas, is flown into the chamber at a rate of from about 20 sccm to about 100 sccm to sputter the growing surface in situ as deposition is performed on the substrate. A bias power greater than 100 W, preferably about 1000 W, is applied to the substrate support member to achieve a preferred C-F bonding structure in the film at an acceptable deposition rate. A bias power of about 1000 W provided the desired gap fill performance at 0.25 $\mu$m widths. Other carbon gas surfaces such as $CH_4$, $C_2H_4$, $C_2H_6$, $C_2H_2$, $C_6H_6$, $CF_4$, $C_2F_6$, $C_3F_8$, $CHF_3$, and $C_6F_6$ and fluorine gas sources such as $CF_4$ $C_2F_6$ $C_3F_8$, $CHF_3$ and $C_6F_6$ may be used so long as the atomic ratios of F:C available in the chamber remain less than 2. Additionally, other inert bombarding gases known in the field can be used.

EXAMPLE 1

The experiment was conducted in an Ultima1υ HDP-CVD reactor available from Applied Materials, Inc. of Santa Clara, Calif. RF frequencies for source and bias generators were 2.0 and 13.56 MHz. Maximum power output of both generators was 5000 W. An α-CF film was deposited by reaction of octafluorocyclobutane ($C_4F_8$) and methane ($CH_4$) under HDP-CVD plasma conditions. The chamber pressure during deposition was less than 10 mtorr. Both octafluorocyclobutane ($C_4F_8$) and methane ($CH_4$) were flown into the chamber at a rate of about 50 sccm for gap fill deposition. Argon was flown into the chamber at a rate of about 50 sccm. A source power of 1000 W and a bias power of 100 W were applied to the source coil and the substrate support member, respectively. 7000 Å of an α-FC film was deposited on the substrate.

EXAMPLE 2
(comparative)

In a comparative example, all parameters were the same except that the bias RF power delivered to the substrate support member was 100 W.

Figure 2A:
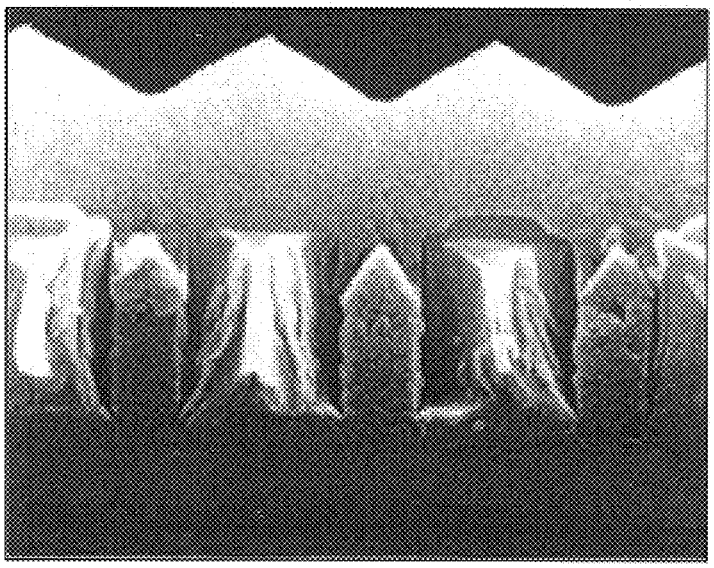
FIGS. 2a and 2b illustrate a comparison of two color drawings prepared from data obtained with a scanning electron microscope having a film deposited at high and low bias power, respectively.
Figure 2B:
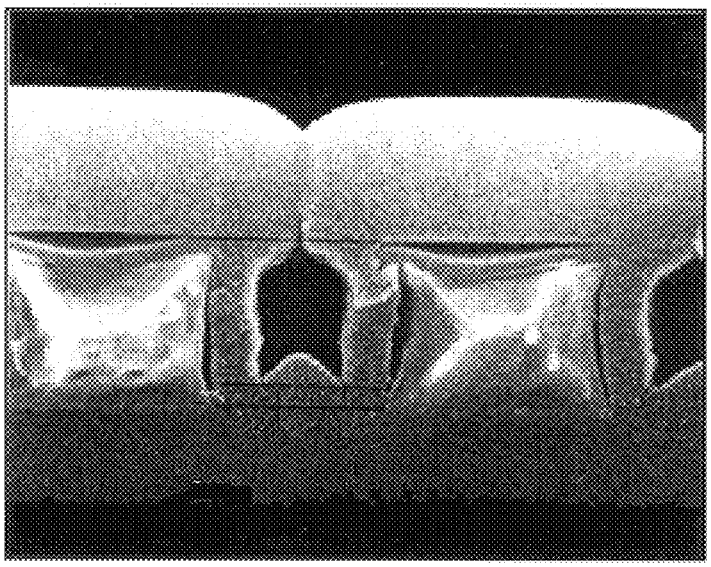

FIGS. 2a and 2b are color drawings prepared from data obtained with a scanning electron microscope which compare the results of the above described examples, respectively. The only difference between the two processes was the level of bias power applied to the substrate and the size of the feature being filled. FIG. 2a shows a 0.25 μm feature and FIG. 2b shows a 0.6 μm feature. The process using, the higher bias power of 1000 W shows complete gap fill of the 0.25 μm feature. Both processes used a source RF power of 1000 W. As shown in the color drawings, a void exists in the gap between metal lines when the lower bias power was used in the process. As the bias power is increased up to about 1000 W, the gap fill performance improves so that smaller features are filled without the formation of voids.

Figure 3:
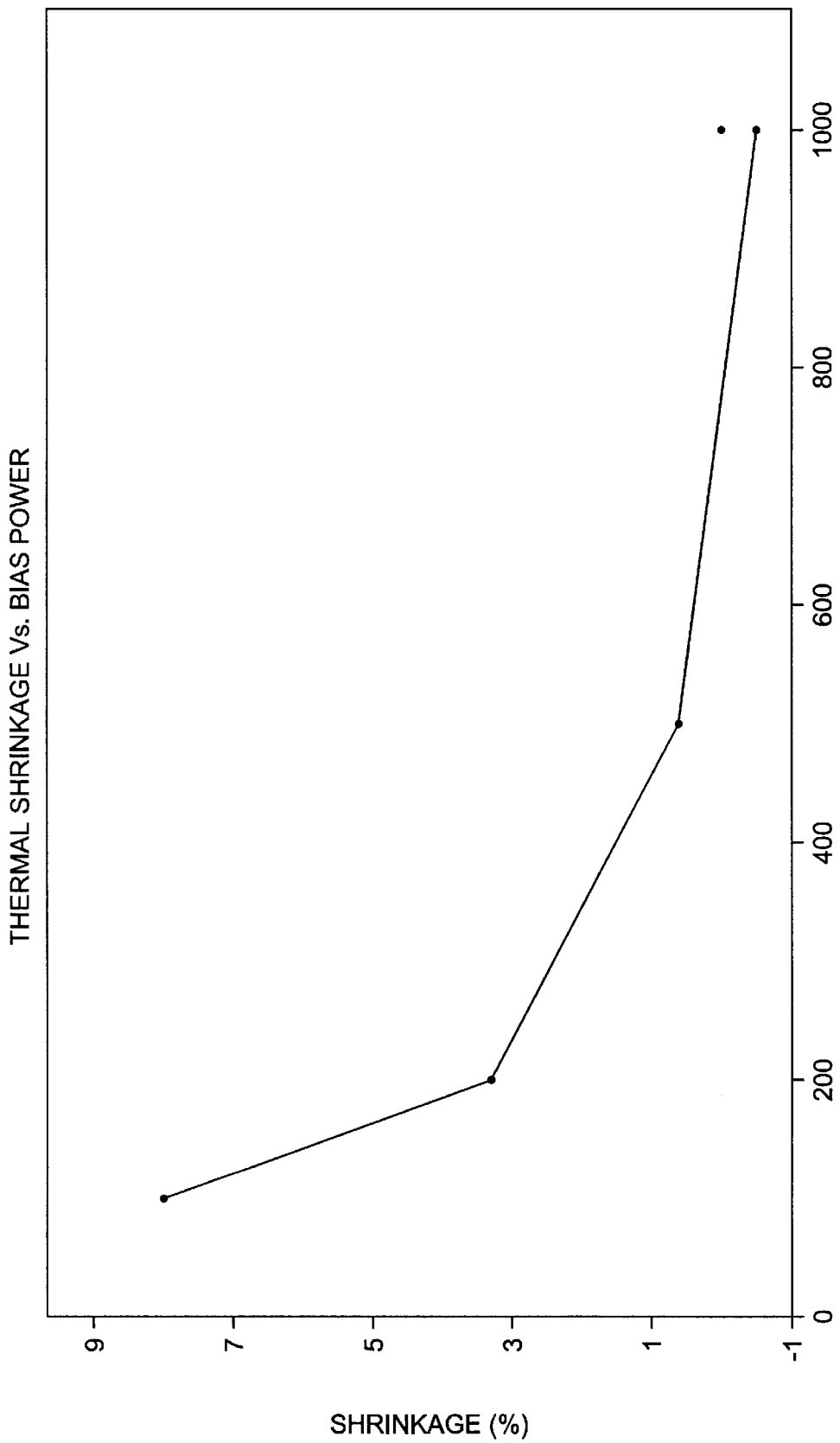
FIG. 3 is a graph showing the relationship between bias power and film shrinkage.

FIG. 3 is a graph showing the relationship between thermal shrinkage and bias power. As the bias power is increased from about 100 W to about 1000 W, thermal shrinkage in the resulting film is reduced from about 8% to less than about 1%. The thermal stability of an α-FC film was monitored by thickness change before and after annealing the as-deposited film at 400° C. in vacuum.

Figure 4:
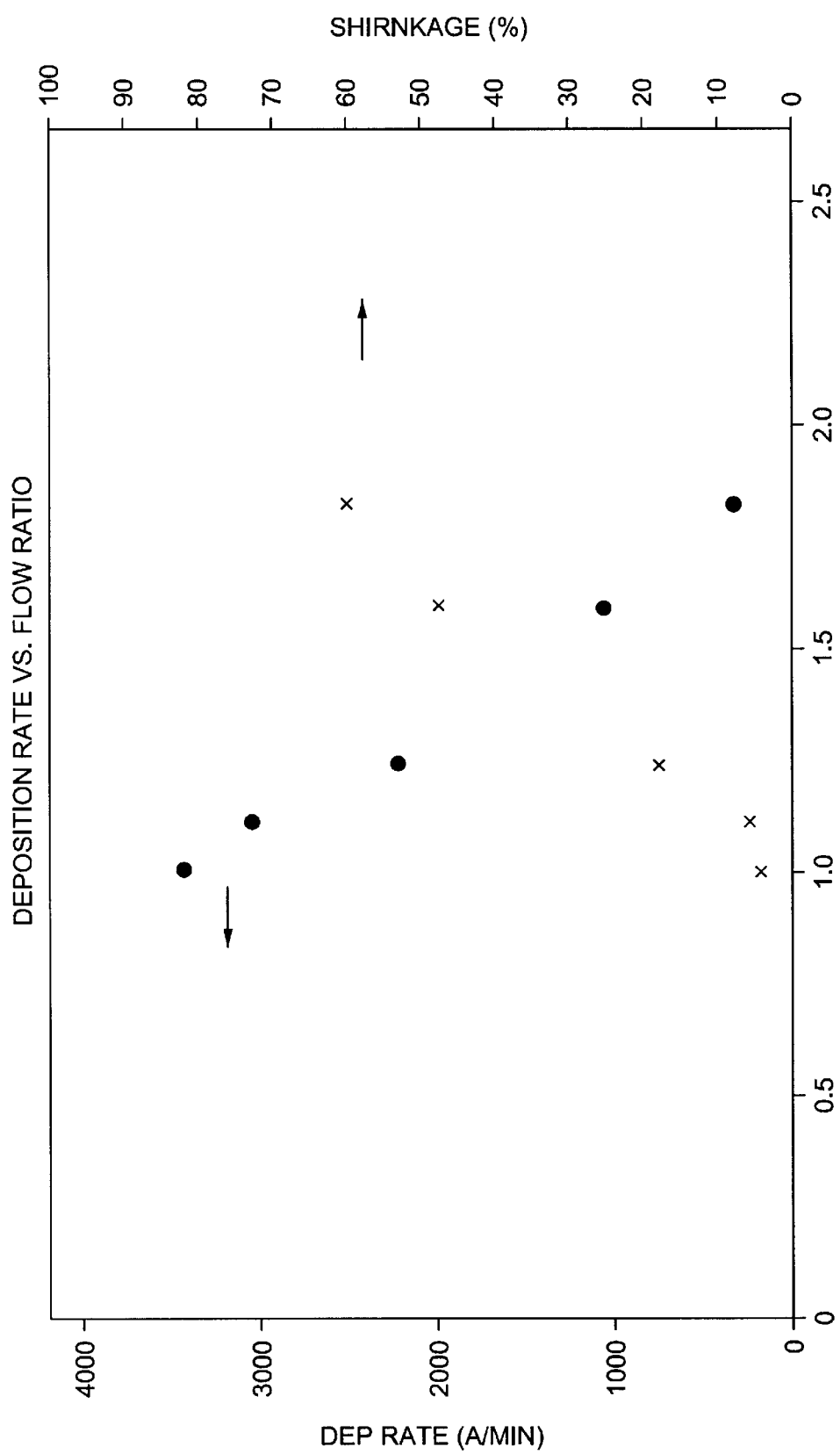
FIG. 4 is a graph showing the relationship between $C_4F_8:CH_4$ ratio and both film shrinkage and deposition rate.

FIG. 4 is a graph showing the relationship between $C_4F_8$:$CH_4$ ratio and both film shrinkage and deposition rate. It was discovered that film shrinkage depends strongly on film composition and deposition temperature. At 1000 W, film shrinkage is at minimum when $CH_4$:$C_4F_8$=1(F:C≦2). Further increase in F content decreases the thermal stability of the α-FC film. Presumably, a film with higher F content is less cross-linked and thus easy to deform at higher temperature. Low hydrogen and oxygen content in the film is another key to the thermal stability because the $CH_x$ group is easy to dissociate at high temperature. TDS spectra confirms that CH and $CF_x$ are the main desorption species during annealing.

Figure 5:
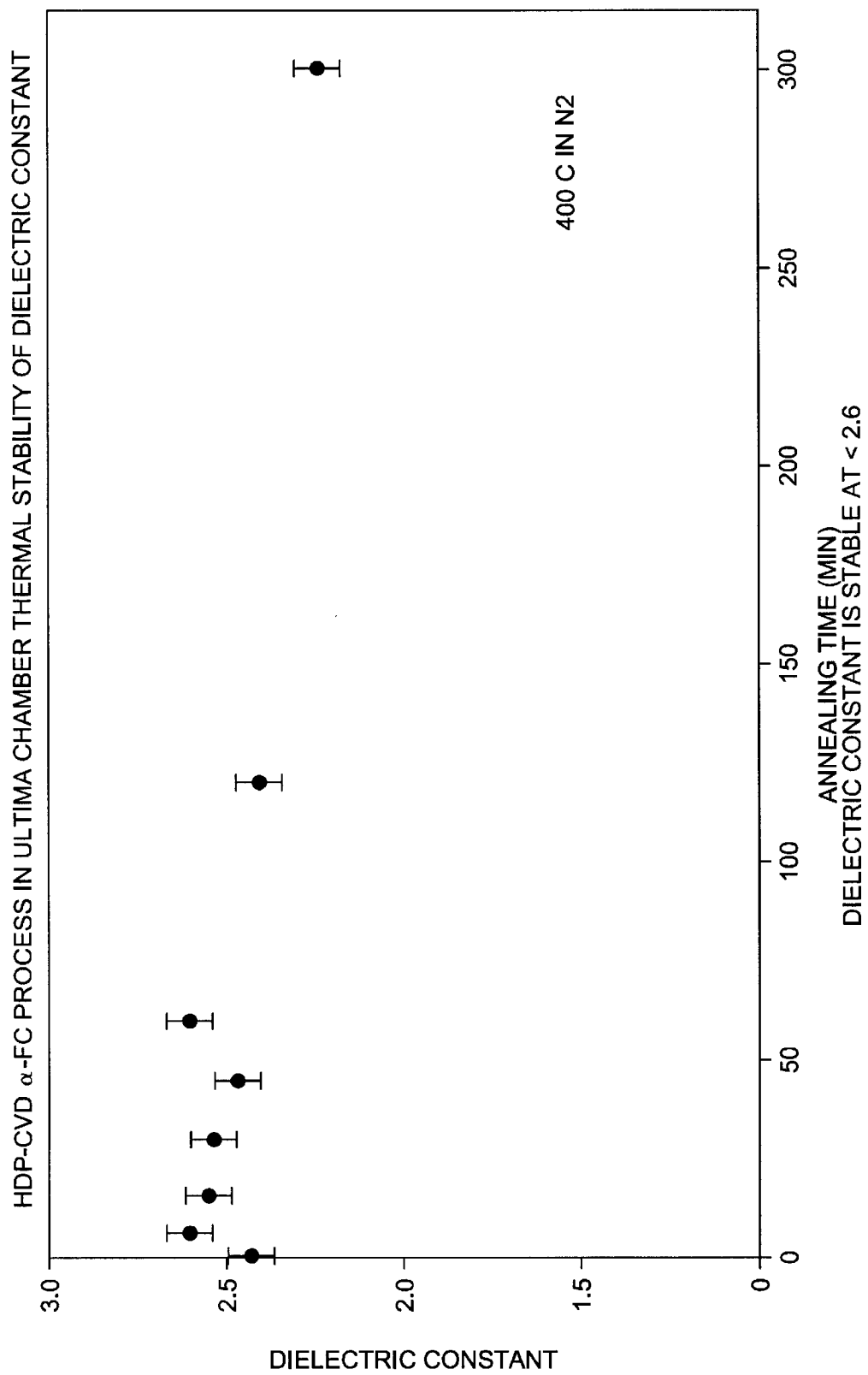
FIG. 5 is a graph showing the relationship between annealing time and dielectric constant.

FIG. 5 is a graph showing the relationship between annealing time and dielectric constant. The dielectric constant of the α-FC film was calculated from the capacitance measurement by a mercury probe at 1 MHz. The dielectric constant value after annealing at 400° C. in $N_2$ did not change over time indicating thermal stability of the film.

Chamber Seasoning Step to Control Outgassing of Fluorine and Other Contaminants

It has also been discovered that out gassing of fluorine from the internal surfaces of a deposition chamber can be blocked by seasoning the chamber walls with a coating of silicon nitride, silicon oxynitride, FSG or combinations thereof. The thickness of the coating on the chamber walls is sufficient to block out gassing of fluorine from the internal surfaces, preferably at least about 100 Å. The chamber seasoning process will typically be carried out by CVD prior to positioning a substrate in the deposition chamber. A process gas recipe is used to deposit silicon nitride or silicon oxynitride on internal surfaces of the chamber. One process for depositing the seasoning film reacts nitrogen with silane at a source power in the range of between about 1500–4500 W. Nitrogen is preferably delivered at a rate of about 100 to about 300 sccm and silane is delivered at a rate of about 50 to about 120 sccm. The chamber temperature can be in the range of 60–70° C. or higher. Another suitable deposition process is described in U.S. Pat. No. 5,589,233 which description is incorporated by reference herein, wherein silicon nitride or silicon oxynitride are deposited on a substrate and exposed internal surfaces of a deposition chamber to block contamination by dopants which are retained on the internal surfaces of the chamber. After seasoning of the chamber walls, a substrate having a patterned metal surface thereon is positioned in the chamber and processed according to the above described processes for depositing a fluorine containing layer or any other known process for forming a fluorine containing film.

Improved Adhesion of Fluorine Containing Dielectric Layers to Metal Surfaces

In still another aspect of the invention, a method is provided for nitrogen stuffing of a metal layer for improving the adhesion of a fluorine containing dielectric film to a substrate having exposed metal surfaces such as patterned metal lines. In one aspect of the invention, a method is provided for nitrogen stuffing of deposited titanium or titanium nitride to form a TiN/$N_2$ surface. Nitrogen ions in a plasma bombard the deposited metal layer and alter the structure of the deposited metal film to improve adhesion of the dielectric film on the metal.

In one specific embodiment, the fluorine containing dielectric material is an amorphous fluorocarbon material formed from deposition process gases including sources of carbon and fluorine, such as methane ($CH_4$) and octafluorocyclobutane ($C_4F_8$), respectively. Other carbon sources may also be used, however, methane or acetylene is preferred. Other fluorine sources include hexafluorobenzene ($C_6F_6$) and hexafluoropropane ($C_3F_6$). Additional fluorine ions may be generated to control fluorination of the polymer film. The amorphous fluorocarbon is a chemically inert, amorphous dielectric material.

The $N_2$ stuffing of titanium nitride is carried out by first depositing a titanium nitride film, or other metal film, having a thickness of less than 500 Å. The titanium nitride is preferably deposited by sputtering a titanium target in a nitrogen ($N_2$) sputtering gas for between about 5 and about 30 seconds. Then flow of $N_2$ is continued into the chamber, and a plasma is struck in the chamber to facilitate reaction between the deposited TiN and the $N_2$ plasma. While a plasma is the preferred method of stuffing, $N_2$ may be provided over the TiN and a different reaction, such as a thermal reaction, may facilitate the reaction between the TiN and the $N_2$. Where a plasma is used, $N_2$ is preferably provided into the chamber at a rate between about 5 sccm and about 500 sccm while the chamber is maintained at a pressure between about 0.5 mTorr and about 5 Torr. Power is either capacitively or inductively coupled into the chamber to excite the $N_2$ into excited neutrals and the like which react with the TiN on the substrate. The substrate temperature is preferably maintained in a range from about room temperature to about 500° C.

Figure 6A:
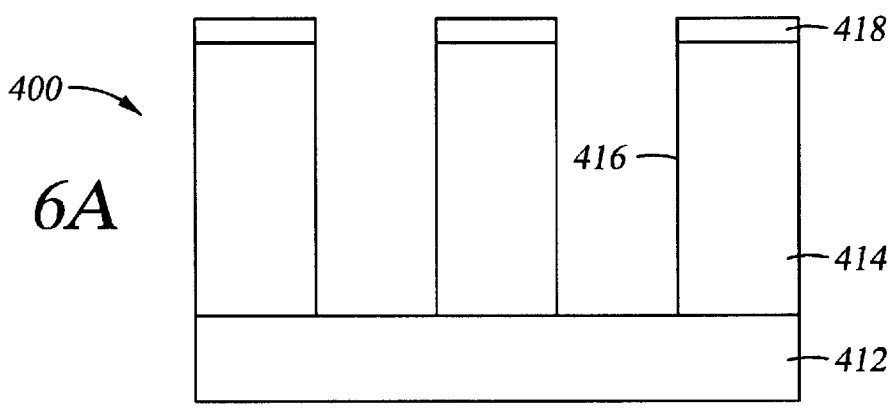
FIG. 6a is a schematic partial sectional view of a substrate comprising aluminum lines deposited by methods known in the art.

FIG. 6A shows a partial cross sectional view of a processed substrate 400 having a dielectric layer 412, such as $SiO_2$, and patterned metal lines 414 which are formed by conventional methods such as metallization and plasma etchings Typical metals used to make vias or lines in processed substrates are aluminum or copper. The patterned metal lines are separated by trenches 416 which are to be filled with a low dielectric material.

Figure 6B:
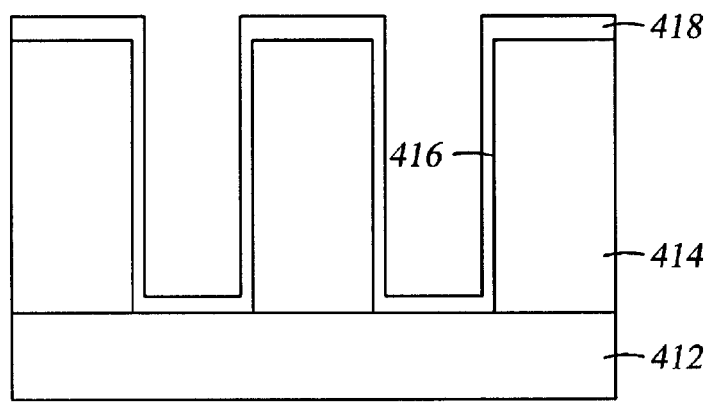
FIG. 6b is a schematic partial sectional view of the substrate of FIG. 4 showing a titanium nitride layer deposited on the substrate and exposed to nitrogen according to the present invention.

Referring to FIG. 6B, a TiN layer 418 is deposited on the substrate 400 of FIG. 4A by physical vapor deposition (PVD) and then exposed to nitrogen to form a TiN/$N_2$ surface having a thickness greater than 5 Å. The TiN/$N_2$ surface is preferably continuous to protect the metal lines 414 from attack by fluorine. The preferred TiN layer 418 comprises anywhere from a monolayer up to about 200 Å of PVD TiN following by nitrogen stuffing to form a continuous TiN/$N_2$ surface having a thickness between 5 Å and 50 Å.

Figure 6C:
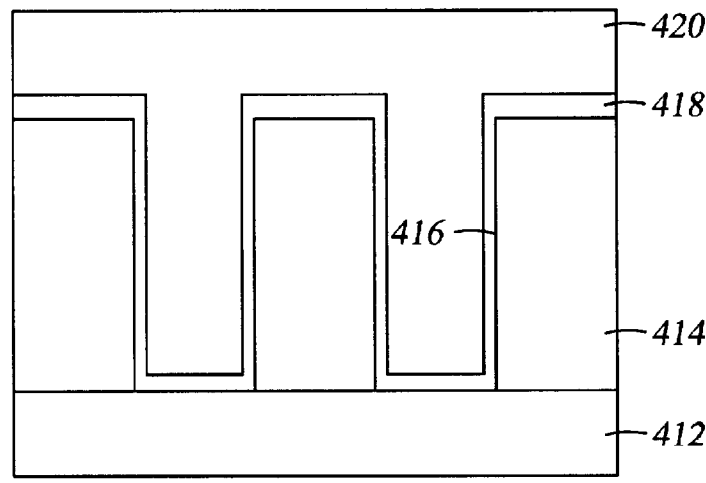
FIG. 6c is a schematic partial sectional view of the substrate of FIG. 5 showing a fluorine containing dielectric material deposited on the substrate.

FIG. 6C is a schematic partial sectional view of the substrate 400 of FIG. 4B showing an amorphous fluorocarbon layer 420 deposited on the TiN/$N_2$ layer 18. The amorphous fluorocarbon layer is a fluorine containing dielectric layer having a low dielectric constant as described above.

While the foregoing is directed to the preferred embodiment of the present invention, other and further embodiments of the invention may be devised without departing from the basic scope thereof, and the scope thereof is determined by the claims which follow.

We claim:

1. A method of forming an amorphous flurocarbon film, comprising:

introducing a substrate into a process chamber and positioning the substrate on a support member connected to a bias power source;

introducing a carbon source gas and a fluorine source gas into the process chamber in amounts that maintain a fluorine to carbon atomic ratio less than 2;

delivering a source power to the chamber sufficient to strike a plasma in the chamber; and applying, a bias power of at least 1000 W to the support member.

2. The method of claim 1 wherein the carbon source gas and the fluorine source gas are a single gas source.

3. The method of claim 1 wherein the carbon source gas and the fluorine source gas are separate gases.

4. The method of claim 3 wherein the carbon source gas is selected from the group consisting of $CH_4$, $C_2H_4$, $C_2H_6$, $C_2H_2$, $C_6H_6$ and combinations thereof.

5. The method of claim 4 wherein the fluorine gas source is selected from the group consisting of $CF_4$, $C_2F_6$, $C_3F_8$, $C_4F_8$, $CHF_3$, $C_6F_6$ and combinations thereof.

6. A method of forming an amorphous fluorocarbon film, comprising:

introducing a substrate having metal surfaces into a process chamber and positioning the substrate on a support member connected to a bias power source;

depositing an adhesive metal layer on the substrate;

forming a metal/$N_2$ surface on the adhesive metal layer by exposing the adhesive metal layer to nitrogen;

introducing a carbon source gas and a fluorine source gas into the process chamber in amounts that maintain a fluorine to carbon atomic ratio less than 2;

delivering a source power to the chamber sufficient to strike a plasma in the chamber; and applying a bias power of at least 1000 W to the support member.

7. The method of claim 6 wherein the carbon source gas and the fluorine source gas are a single gas source.

8. The method of claim 6 wherein the carbon source gas and the fluorine source gas are separate gases.

9. The method of claim 8 wherein the carbon source gas is selected from the group consisting of $CH_4$, $C_2H_4$, $C_2H_6$, $C_2H_2$ and $C_6H_6$ and combinations thereof.

10. The method of claim 9 wherein the fluorine gas source is selected from the group consisting of $CF_4$, $C_2F_6$, $C_3F_8$, $C_4F_8$, $CHF_3$, and $C_6F_6$ and combinations thereof.

11. The method of claim 6, wherein the adhesive metal layer is exposed to a nitrogen plasma.

12. The method of claim 6, wherein the metal/$N_2$ surface has a thickness greater than 5 Å.

13. A method of forming an amorphous fluorocarbon film, comprising:

introducing a substrate into a process chamber and positioning the substrate on a support member connected to a bias power source;

depositing a titanium nitride layer on the substrate;

forming a metal/$N_2$ surface on the titanium nitride layer by exposing the titanium nitride layer to nitrogen;

introducing a carbon source gas and a fluorine source gas into the process chamber in amounts that maintain a fluorine to carbon atomic ratio less than 2;

delivering a source power to the chamber sufficient to strike a plasma in the chamber; and applying a bias power to the support member in a range from 1000 W to about 2000 W.

14. The method of claim 13 wherein the carbon source gas and the fluorine source gas are a single gas source.

15. The method of claim 13 wherein the carbon source gas and the fluorine source gas are separate gases.

16. The method of claim 15 wherein the carbon source gas is selected from the group consisting of $CH_4$, $C_2H_4$, $C_2H_6$, $C_2H_2$ and $C_6H_6$ and combinations thereof.

17. The method of claim 16 wherein the fluorine gas source is selected from the group consisting of $CF_4$, $C_2F_6$, $C_3F_8$, $C_4F_8$, $CHF_3$, and $C_6F_6$ and combinations thereof.

18. The method of claim 13, wherein the titanium nitride layer is exposed to a nitrogen plasma.

19. The method of claim 13, wherein the TIN/$N_2$ surface has a thickness greater than 5Å.

* * * * *

UNITED STATES PATENT AND TRADEMARK OFFICE
CERTIFICATE OF CORRECTION

PATENT NO. : 6,211,065 B1
DATED : April 3, 2001
INVENTOR(S) : Xi, et al.

It is certified that error appears in the above-identified patent and that said Letters Patent is hereby corrected as shown below:

Title page,
Title,
Please replace " AND" with -- AN --.

Inventor names,
Please replace " Lie-Yea" with -- Lie-Yen --.

Column 1,
Line 50, please replace " Such" with -- such --.

Column 2,
Line 43, please replace " (α-FC" with -- α-FC --.
Line 58, please replace " (α-FC" with -- α-FC --.

Column 5,
Line 1, please replace " processing (" with -- processing --.
Line 8, please replace " clhamber" with -- chamber --.
Line 52, please replace " tulle" with -- tune --.
Line 63, please replace " oases" with -- gases --.

Column 6,
Line 15, please replace " (,as" with -- gas --.
Line 18, please replace " (gases" with -- gases --.
Line 65, please replace " ROMN" with -- ROM --.

Column 7,
Line 14, please replace " pro(gram" with -- program --.
Line 56, please replace " ," with -- . --.

Column 8,
Line 10, please replace " (Doing" with -- going --.
Line 21, please replace " ill" with -- in --.

Column 9,
Line 24, please replace " regulating(" with -- regulating --.
Line 59, please replace " hi" with -- in --.

UNITED STATES PATENT AND TRADEMARK OFFICE
CERTIFICATE OF CORRECTION

PATENT NO. : 6,211,065 B1
DATED : April 3, 2001
INVENTOR(S) : Xi, et al.

It is certified that error appears in the above-identified patent and that said Letters Patent is hereby corrected as shown below:

Column 10,
Line 26, please delete " :".
Line 32, please replace "vases" with -- gases --.
Line 50, please replace "(gas" with -- gas --.
Line 66, please replace " Ultima1υ" with -- Ultima™ --.

Column 11,
Line 2, please replace " MIHz" with -- MHz --.
Line 3, please replace " (generators" with --generators --.
Line 25, please delete " ,".

Column 13,
Line 2, please replace " etchings" with -- etching --.
Line 39, please delete " ,".

Column 14,
Line 53, please replace " TIN/N$_2$" with -- TiN/N$_2$ --.

Signed and Sealed this

Thirtieth Day of October, 2001

Attest:

Nicholas P. Godici

NICHOLAS P. GODICI
*Attesting Officer*  *Acting Director of the United States Patent and Trademark Office*